United States Patent [19]
Huang et al.

[11] Patent Number: 5,747,379
[45] Date of Patent: May 5, 1998

[54] METHOD OF FABRICATING SEAMLESS TUNGSTEN PLUG EMPLOYING TUNGSTEN REDEPOSITION AND ETCH BACK

[75] Inventors: Yuan-Chang Huang; Kuan-Hui Chang, both of Hsin-Chu, Taiwan

[73] Assignee: Taiwan Semiconductor Manufacturing Company, Ltd., Hsinchu, Taiwan

[21] Appl. No.: 868,472

[22] Filed: Jun. 3, 1997

Related U.S. Application Data

[63] Continuation of Ser. No. 583,920, Jan. 11, 1996, abandoned.

[51] Int. Cl.⁶ .................................................. H01L 21/283
[52] U.S. Cl. ........................ 438/586; 438/627; 438/629; 438/648; 438/672
[58] Field of Search ............................. 438/233, 586, 438/627, 628, 629, 637, 643, 648, 653, 654, 656, 672; 257/751, 763

[56] References Cited

U.S. PATENT DOCUMENTS

| | | | |
|---|---|---|---|
| 4,960,732 | 10/1990 | Dixit et al. | 437/192 |
| 5,332,691 | 7/1994 | Kinoshita et al. | 437/192 |
| 5,374,849 | 12/1994 | Tada | 257/751 |
| 5,387,550 | 2/1995 | Cheffingo et al. | 437/189 |
| 5,422,310 | 6/1995 | Ito | 437/192 |
| 5,470,789 | 11/1995 | Misawa | 437/190 |
| 5,470,792 | 11/1995 | Yamada | 437/195 |
| 5,496,773 | 3/1996 | Rhodes et al. | 438/672 |
| 5,523,624 | 6/1996 | Chen et al. | 257/751 |
| 5,622,894 | 4/1997 | Jang et al. | 438/643 |
| 5,656,545 | 8/1997 | Yu | 438/627 |

OTHER PUBLICATIONS

Wolf, S., Silicon Processing, vol. 2, 1990, Lattice Press, pp. 103–109, 1990.

*Primary Examiner*—T. N. Quach
*Attorney, Agent, or Firm*—George O. Saile; Stephen B. Ackerman

[57] ABSTRACT

A process has been developed in which seamless tungsten plugs are used to fill deep, narrow contact holes. The process features initially forming a tungsten plug in a contact hole, via tungsten LPCVD processing, followed by an RIE etch back, and recessing process. A second tungsten LPCVD procedure is then used to fill seams or defects in the underlying tungsten plug. Another RIE etch back procedure is then employed to create a seamless, composite tungsten plug structure, in the deep, narrow contact hole.

23 Claims, 5 Drawing Sheets

METHOD OF FABRICATING SEAMLESS TUNGSTEN PLUG EMPLOYING TUNGSTEN REDEPOSITION AND ETCH BACK

This is a continuation of application Ser. No. 08/583,920 filed Jan. 11, 1996, abandoned.

BACKGROUND OF THE INVENTION

(1) Field of the Invention

The present invention relates to the fabrication methods used to produce semiconductor devices, and more specifically to methods used to produce tungsten filled via or contact holes.

(2) Description of Prior Art

The semiconductor industry is continually striving to produce higher performing silicon devices, while also attempting to reduce the cost of fabricating these higher performing devices. The ability to fabricate silicon chips, with sub-micron features, has allowed the performance and cost objectives, in part, to be realized. The trend to micro-miniaturization, or the use of smaller silicon device features, has resulted in significant decreases in performance degrading resistances and capacitances, thus allowing faster silicon chips to be produced. In addition the use of sub-micron features allows a greater amount of smaller silicon chips to be obtained from a specific size starting substrate, thus ultimately reducing the manufacturing cost of the chip. Micro-miniaturazation has been accomplished by advances in many semiconductor fabrication disciplines, including photolithography and reactive ion etching, (RIE). The use of more sophisticated exposure cameras, as well as the use of more sensitive photoresist materials, have allowed sub-micron images to be routinely produced in photoresist materials. In addition similar advances in dry etching apparatus and procedures have allowed the sub-micron images in photoresist, to be successfully transferred to underlying materials used for the fabrication of silicon chips.

However the use of silicon devices, with sub-micron features, can result in yield and reliability problems, not encountered with counterparts fabricated using less aggressive dimensions. For example in order to increase silicon device density, contact holes, used to connect an overlying interconnect metallization layer to an underlying device region, are fabricated with widths or diameters smaller then 0.5 um. The sub-micron, contact hole openings make it difficult to use aluminum based metallizations as a contact hole fill material. First it is difficult to chemically vapor deposit aluminum, and the use of sputtered aluminum deposition does not result in the desired conformality needed to adequately fill the contact hole with sub-micron openings. In addition the increased current densities encountered with aluminum filled, sub-micron contact holes, could present reliability problems in terms of electromigration. Therefore the industry has used low pressure chemical vapor deposited, (LPCVD), tungsten, as a fill material for narrow diameter contact holes. The more conformal LPCVD process, and the ability of tungsten to withstand high current densities, has made tungsten the material most used, by the semiconductor industry, when filling contact holes with narrow openings.

The use of LPCVD techniques, although resulting in improved metal fill characteristics for narrow contact holes, when compared to counterparts filled with sputtered metallizations, still present shortcomings that have to be addressed. A basic characteristic of an LPCVD contact hole fill, is the deposition of the metal on the sides of the deep, narrow contact hole. Sometimes at the conclusion of the metal fill process, a seam or void is present at the point where the metal coatings, on the sides of the contact hole, converge. This void or seam has been observed for narrow contact holes filled with LPCVD tungsten. In addition subsequent exposure of the tungsten seam, to dry etching processes, used to remove unwanted tungsten from regions outside the contact hole, aggravates or increases the size of the seam, sometimes creating a large void. The large void makes it difficult for overlying sputtered aluminum metallizations to properly fill, resulting in thin areas of aluminum coverage, and possible electromigration risks. Several attempts at optimizing the LPCVD tungsten fill procedure, to reduce the severity of the seam, has been made, such as an invention by Kinoshita, et al, in U.S. Pat. No. 5,332,691. In addition attempts at filling the tungsten seam via selectively depositing silicon in the tungsten seam, has been made, such as an invention by Cheffings, et al, in U.S. Pat. No. 5,387,550. However these solutions to the tungsten seam problem are complex and costly. This invention will offer a process for alleviating the tungsten seam phenomena, via a second tungsten deposition and etch back procedure, performed after the initial tungsten deposition and etch back procedure.

SUMMARY OF THE INVENTION

It is an object of this invention to provide a process for fabricating tungsten filled, small diameter contact holes, to be used to connect active silicon device regions, in an underlying semiconductor substrate, to an overlying metallization.

It is another object of this invention to initially fill the small diameter contact hole with chemically vapor deposited tungsten.

It is yet another object of this invention to form a recessed tungsten plug in the small diameter contact hole by removing tungsten from regions outside the small diameter contact hole.

It is still yet another object of this invention to deposit a second tungsten layer, filling any seam or void in the recessed tungsten plug, and then removing the second tungsten layer from regions outside the small diameter contact hole, creating an seamless tungsten plug in the small diameter contact hole.

In accordance with the present invention a process is described for creating a seamless tungsten plug, in a small diameter contact hole. A contact hole is opened in a dielectric layer, to an active device region in a semiconductor substrate. A layer of titanium, to be used for adhesion and contact purposes, and a layer of titanium nitride, to be used as a barrier to protect underlying materials from subsequent process reactants, are deposited. Chemically vapor deposition of tungsten is next performed to fill the small diameter contact hole, followed by an etch back procedure, used to remove unwanted tungsten from all areas except from the tungsten filled contact hole, creating a tungsten plug. The etch back procedure is extended to recess the tungsten plug in the small diameter contact hole. A second deposition of tungsten is next performed, filling any void or seam in the recessed tungsten plug, again followed by an etch back procedure, used to again remove unwanted tungsten from all areas except from the tungsten filled contact hole, creating a seamless tungsten plug, in the small diameter contact hole. Interconnect metallization and patterning complete the process.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of creating seamless tungsten plugs, for small diameter contact holes, will now be described. This invention can be used as part of metal oxide semiconductor field effect transistors, (MOSFET), devices, that are currently being manufactured in industry, therefore only the specific areas, unique to understanding this invention, will be covered in detail.

Figure 1:
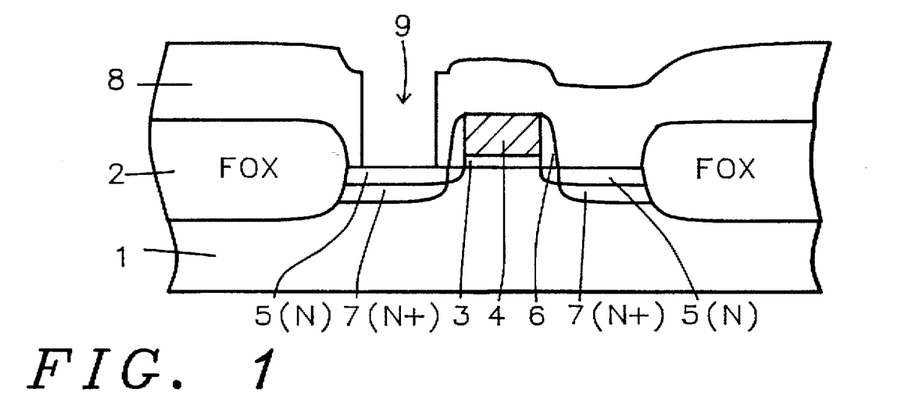
FIG. 1, which schematically, in cross-sectional style, shows a silicon device, at a stage prior to filling a small diameter contact hole with tungsten.

A typical N channel, (NFET), device, that small diameter contact holes, filled with seamless tungsten plugs, can be applied to, is schematically shown in FIG. 1. A substrate, 1, composed of P type, single crystalline silicon, with a <100> crystallographic orientation, is used. Thick field oxide regions, 2, (FOX), are formed for isolation purposes. The FOX regions are formed by patterning a composite insulator, oxidation mask, composed of an overlying silicon nitride layer, and an underlying silicon dioxide layer. Patterning is accomplished via conventional photolithographic and reactive ion etching, (RIE), procedures. After photoresist removal, performed via plasma oxygen ashing, followed by careful wet cleans, a thick FOX insulator is grown in the silicon regions not covered with the composite insulator oxidation mask. The FOX insulator is obtained via thermal oxidation in an oxygen—steam ambient, at a temperature between about 850° to 1050° C., grown to a thickness between about 4000 to 6000 Angstroms. After removal of the insulator composite oxidation mask, using hot phosphoric acid for the silicon nitride layer, and a buffered hydrofluoric acid solution for the underlying silicon dioxide layer, a thin silicon dioxide, gate insulator, 3, is grown in an oxygen steam ambient, at a temperature between about 800° to 1000° C., to a thickness between about 50 to 300 Angstroms. A polysilicon layer is next deposited using low pressure chemical vapor deposition, (LPCVD), processing, at a temperature between about 500° to 700° C., to a thickness between about 1500 to 4000 Angstroms. The polysilicon can be grown using insitu doping techniques via the addition of either phosphine or arsine, to a silane ambient. The polysilicon can also be deposited intrinsically and doped via ion implantation of either phosphorous or arsenic, at an energy between about 50 to 100 Kev., at a dose between about 1E15 to 1E16 atoms/cm$^2$. Conventional photolithographic and RIE procedures, using Cl$_2$ as an etchant, are used to create polysilicon gate structure, 4, shown schematically in FIG. 1.

After photoresist removal, via use of plasma oxygen ashing and careful wet cleans, an N type, lightly doped source and drain region, 5, is formed via use of an ion implantation procedure, using phosphorous at an energy between about 30 to 60 Kev., at a dose between about 1E12 to 5E13 atoms/cm$^2$. A silicon oxide layer is next deposited using either LPCVD or plasma enhanced chemical vapor deposition, (PECVD), procedures, at a temperature between about 400° to 800° C., to a thickness between about 1500 to 4000 Angstroms, using tetraethylorthosilicate as a source. An anisotropic, RIE procedure, using CHF$_3$ as an etchant, is used to create insulator sidewall spacer, 6, shown schematically in FIG. 1. Another ion implantation process, using arsenic at an energy between about 50 to 100 Kev., and at a dose between about 1E14 to 5E15 atoms/cm$^2$, is used to create the heavily doped source and drain region, 7.

Another silicon oxide layer, 8, is deposited using either LPCVD, PECVD, or atmospheric pressure chemical vapor deposition, (APCVD), processing, at a temperature between about 400° to 800° C., to a thickness between about 5000 to 10000 Angstroms. Photolithographic and RIE procedures, using CHF$_3$ and CF$_4$ as etchants, are then used to open contact hole, 9, exposing heavily doped source and drain region, 7. More aggressive designs, employing sub-micron features, results in contact holes exhibiting high aspect ratios, that is the depth of the contact hole, divided by the width of the contact hole opening. The size of the opening for contact hole, 9, is between about 0.3 to 0.5 um, in diameter, resulting in high aspect ratios between about 1 to 3, making it more difficult to fill with conventional metallization deposition processes, such as sputtering or LPCVD, then larger contact hole counterparts. FIG. 1, schematically depicts this structure after photoresist removal, accomplished via plasma oxygen ashing, followed by careful wet cleans.

Figure 2:
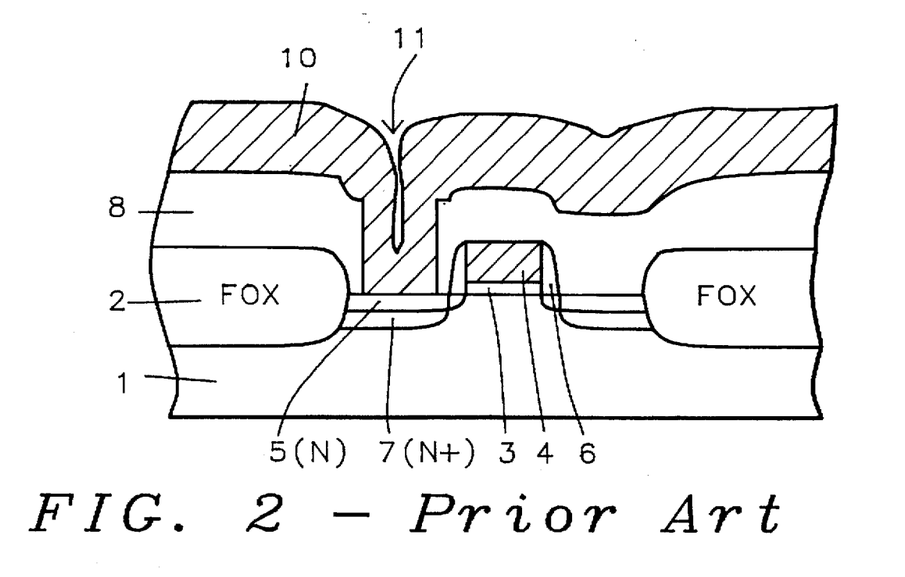
FIGS. 2–4, which schematically, in cross-sectional style, show prior art, in which tungsten seams were formed, resulting in poor conformality of an overlying interconnect metallization structure.
Figure 3:
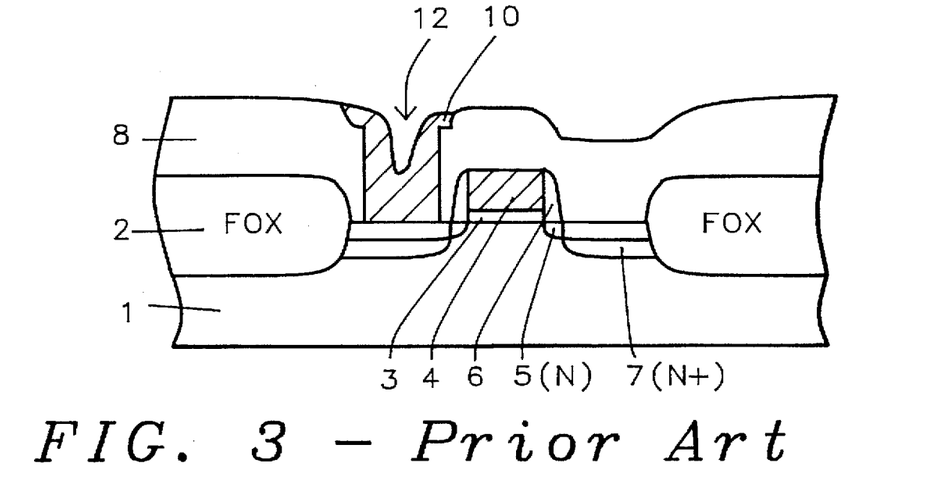
Figure 4:
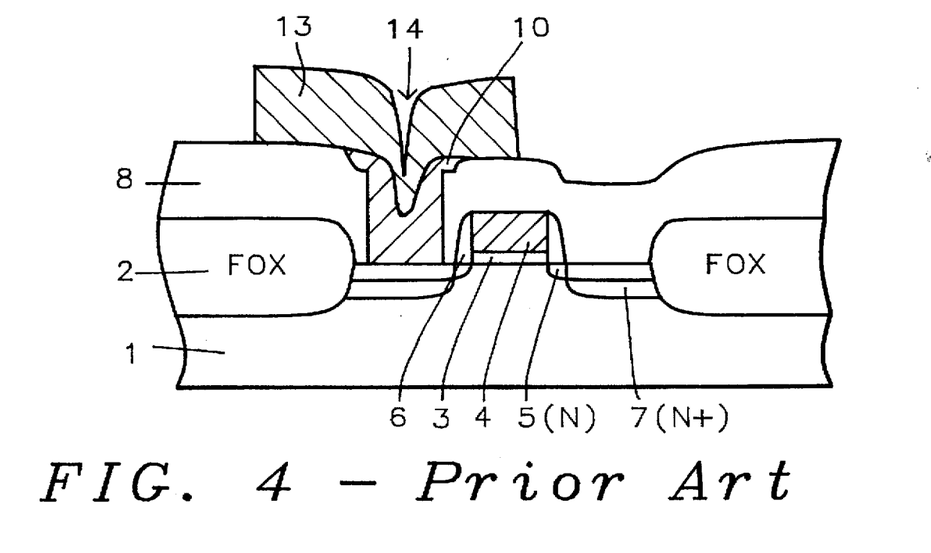

FIGS. 2–4, schematically represent prior art, and attempts at filling high aspect ratio contact holes, with LPCVD tungsten. FIG. 2, shows the deposition of a tungsten layer, 10, performed using LPCVD processing, attempting to fill a high aspect ratio contact hole, 9, using tungsten hexafluoride as a source, at a temperature between about 400° to 500° C., to a thickness between about 4000 to 8000 Angstroms. The filling of contact hole, 9, proceeds by tungsten deposition on the sidewalls of contact hole, 9. At the conclusion of the deposition it is possible that a seam, 11, in the tungsten fill can result due to the imperfect convergence of the tungsten coated sidewalls. Blanket, selective RIE processing, used to form a tungsten plug in contact hole, 9, by removal of unwanted tungsten from areas outside contact hole, 9, can attack seam, 11, creating a larger seam, or opening, 12, shown schematically in FIG. 3. The harmful consequence of opening, 12, in the tungsten plug, 10, is the inability of the subsequent overlying interconnect metallization, 13, to conformally deposit on the underlying tungsten plug. The poor conformality of an overlying metallization, such as a sputtered aluminum based layer, results in a thinner then desired interconnect metallization layer, specifically in region, 14, where the interconnect metallization overlies opening, 12, in the tungsten plug. The thin interconnect metallization layer will experience higher current densities in the thinner region, 14, thus increasing the risk of electromigration failure. This is shown schematically in FIG. 4.

Figure 5:
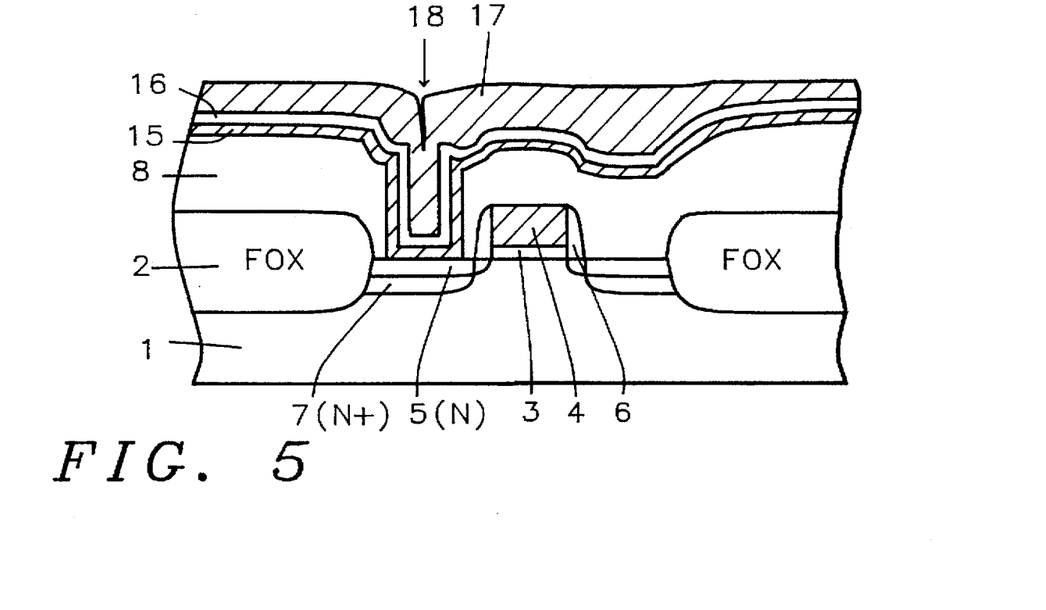
FIGS. 5–9, which schematically, in cross-sectional style, show the stages of tungsten deposition, etch back, tungsten redeposition and etch back, used to create seamless tungsten plugs for small diameter contact holes.
Figure 6:
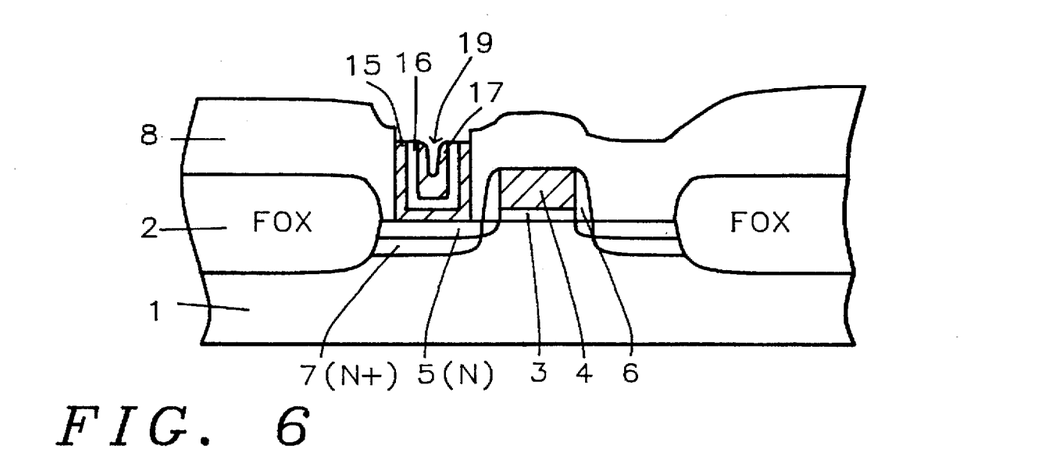

A process will now be described in which the defect, or opening, in a tungsten plug, used to fill a high aspect ratio contact hole, is corrected via a redeposition and etch back of a second tungsten layer. Again applying this invention to the N channel structure depicted in FIG. 1, a buffered hydrofluoric acid pre-clean is used to remove native oxides from the surface of heavily source and region, 7, at the bottom of the contact hole. The dimensions of the contact hole are; an opening of between about 0.3 to 0.5 um, in diameter, and with a depth between about 5000 to 10000 Angstroms, resulting in aspect ratios between about 1 to 3. A layer of titanium, 15, shown in FIG. 5, is deposited using r.f. sputtering, to a thickness between about 200 to 500 Angstroms. The titanium layer, 15, is used to optimize the contact resistance of subsequent overlying materials, to underlying source and drain region, 7. In addition titanium layer, 15, provides excellent adhesion to the silicon oxide sidewalls, of contact hole, 9. Next a layer of titanium nitride, 16, is deposited, again via the use of r.f. sputtering, to a thickness between about 500 to 1000 Angstroms. The titanium nitride layer serves as a barrier to protect underlying materials, such as titanium layer, 14, as well as source and drain region, 7, from the deleterious effects of by-products produced during subsequent processing. The decomposition of tungsten hexafluoride, used as a source for LPCVD tungsten, produces fluorine containing by-products that can react with titanium or silicon, if not protected. Tungsten layer, 17, is next deposited using LPCVD processing, at a temperature between about 400° to 500° C., using tungsten hexafluoride and silane, to a thickness between about 6000 to 8000 Angstroms. The mechanism of filling high aspect ratio holes with LPCVD metallizations, again results in a tungsten seam, 18, at the point of convergence of the tungsten coated sidewalls. This is schematically shown in FIG. 5. A blanket, selective, RIE etch back process, using $SF_6$ in nitrogen as an etchant, is used to create a tungsten plug in the high aspect ratio contact hole, by removal of unwanted tungsten from all regions, outside of the contact hole. The etch back is extended to insure removal of both titanium nitride, 16, as well as titanium, 15, from the top surface of silicon oxide layer, 8. The extended etch back process results in the tungsten plug being recessed between about 1000 to 2000 Angstroms below the top surface of dielectric layer, 8. This is shown schematically in FIG. 6. Besides a recessed tungsten plug, 17, in the contact hole, the original seam, 18, develops into the unwanted larger seam or void, 19, as a result of the extended etch back process.

Figure 7:
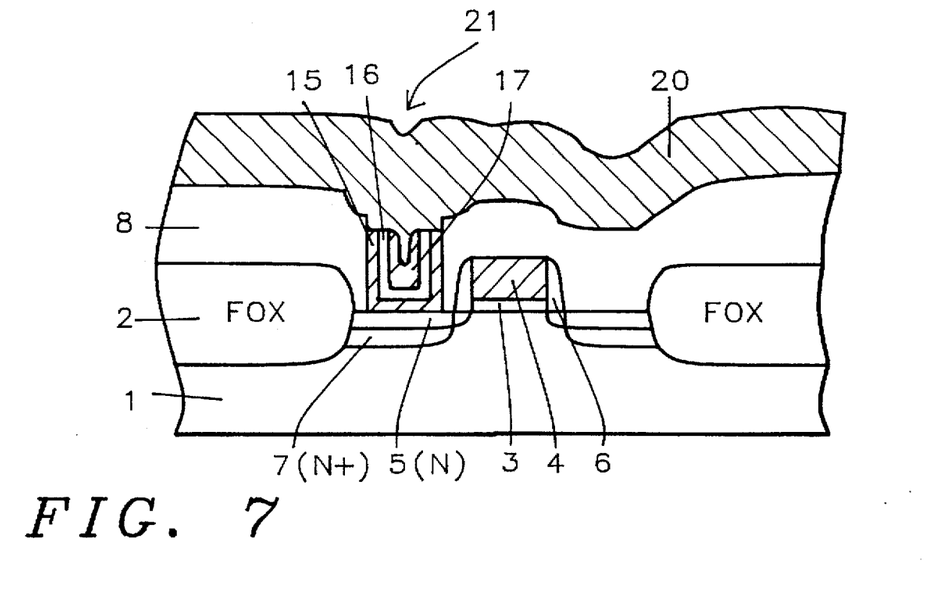
Figure 8:
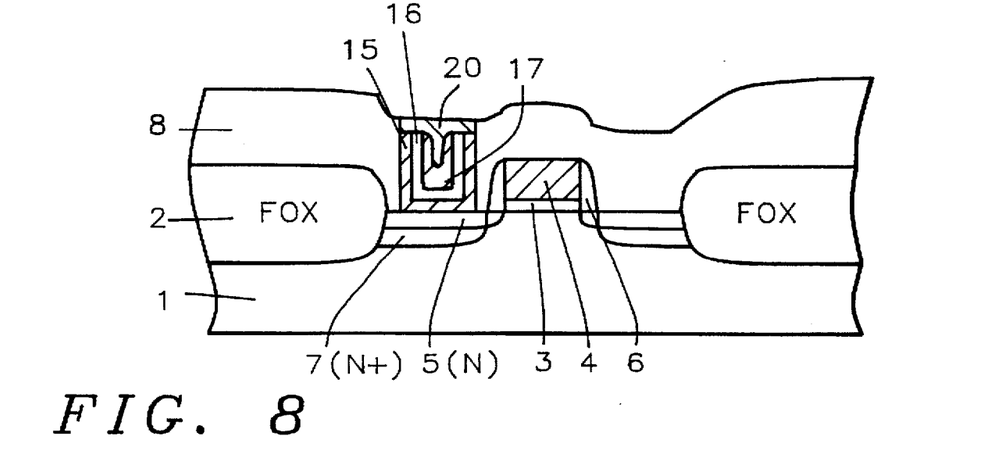
Figure 9:
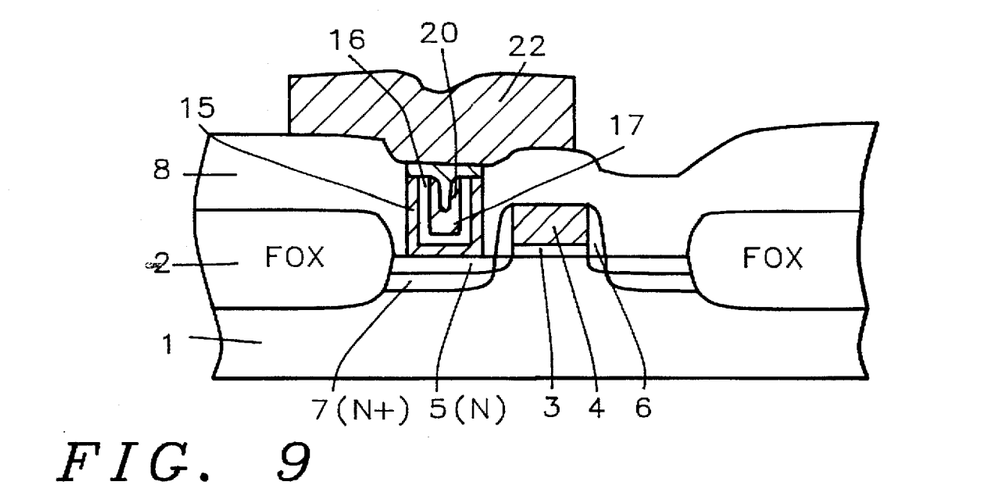

FIGS. 7–8, will now show a process used to overcome, or close void, 19. A second layer of tungsten, 20, is deposited, again using LPCVD processing, at a temperature between about 400° to 500° C., to a thickness between about 3000 to 5000 Angstroms, again via the use of tungsten hexafluoride and silane. The deposition of the second tungsten layer reduces the severity of void, 19, resulting in the formation of only a mild crevice, 21. This is shown in FIG. 7. The etch back procedure, used to remove unwanted tungsten layer, 20, from the surface of silicon oxide layer, 8, is again performed using a RIE process, employing $SF_6$ in nitrogen, as an etchant. The resulting tungsten plug, composed of underlying tungsten layer, 17, and overlying tungsten layer, 20, is schematically shown in FIG. 8. The mild crevice, 21, is not transferred to the tungsten plug during the etch back process. A metallization layer of aluminum, containing between about 0.5 to 3.0% copper, is deposited using r.f. sputtering, to a thickness between about 4000 to 8000 Angstroms. Conventional photolithographic and RIE procedures, using $Cl_2$ as an etchant, are used to create metallization interconnect structure, 22, shown in FIG. 9. The interconnect structure, 22, unlike counterpart structure, 13, previously shown in FIG. 4, does not exhibit thinning or poor conformality. This is accomplished by depositing the aluminum based metallization layer on a voidless, or seamless, underlying tungsten plug. Therefore the risk of aluminum electromigration failures, due to high current densities in thin aluminum regions, is reduced. Photoresist removal is once again accomplished via the use of plasma oxygen ashing, followed by careful wet cleans.

This process, although shown for tungsten filled contact holes, used to connect overlying interconnect metallization structures, to underlying active silicon device regions, can also be applied to tungsten filled via holes, used to connect two levels of interconnect metallization layers. In addition this process, although shown as an application for an N channel, (NFET), device, can also be applied to P channel, (PFET), devices, to complimentary, (CMOS), devices, as well as to BiCMOS devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device, on a semiconductor substrate, using a metal filled contact hole, to provide electrical contact between an underlying conductive region, on a semiconductor substrate, and an overlying interconnect metallization structure, comprising the steps of:

providing said underlying conductive region, on said semiconductor substrate;

depositing a dielectric layer on said semiconductor substrate, including depositing said dielectric layer on said underlying conductive region;

photolithographic processing to open a region in a photoresist layer, exposing said dielectric layer, directly overlying a specific area of said underlying conductive region;

anisotropic etching of said dielectric layer, in opened region of said photoresist layer, to create a contact hole, between about 0.30 to 0.50 µM, in diameter, in said dielectric layer, to said specific area of said underlying conductive region;

removing said photoresist layer;

surface cleaning of said specific area, of said underlying conductive region;

depositing an adhesive layer, to a thickness between about 200 to 500 Angstroms, on top surface of said dielectric layer, on sides of said contact hole, and on said specific area, of said underlying conductive layer;

depositing a barrier layer, to a thickness between about 500 to 1000 Angstroms, on said adhesive layer;

depositing a first metal layer, on said barrier layer, filling said contact hole, resulting in a seam in the center of said first metal layer, in said contact hole;

removing said first metal layer, said barrier layer, and said adhesive layer, from top surface of said dielectric layer, forming a first metal plug, comprised of said first metal layer, with said seam in center of said first metal layer, of said barrier layer, and of said adhesive layer, in said contact hole;

anisotropic etching of said first metal plug, to recess said first metal plug, in said contact hole, below the top surface of said dielectric layer, with said adhesive layer, said barrier layer, and said first metal layer, all recessed to the same level below the top surface of said dielectric layer, wherein anisotropic etching of said first metal plug, changes said seam, in center of said first metal layer, to a void, in the center of said first metal layer;

depositing a second metal layer on said first metal plug, completely filling said void, in center of said first metal layer, in said contact hole, and depositing said second metal layer on the top surface of said dielectric layer;

removing said second metal layer from top surface of said dielectric layer, forming a composite metal plug, in said contact hole;

depositing an interconnect metallization layer on top surface of said dielectric layer, and on said composite metal plug; and patterning of said interconnect metallization layer, to form said metal interconnect structure.

2. The method of claim 1, wherein said underlying conductive region, on said semiconductor substrate, is an N type, heavily doped source and drain region, of a MOSFET device.

3. The method of claim 1, wherein said dielectric layer is silicon oxide, deposited using either LPCVD, PECVD, or APCVD processing, at a temperature between about 400° to 800° C., to a thickness between about 5000 to 10000 Angstroms.

4. The method of claim 1, wherein said contact hole is formed via anisotropic, RIE processing, using $CHF_3$ as an etchant, with said contact hole having an opening between about 0.3 to 0.5 um, in diameter, resulting in an aspect ratio of between about 1 to 3.

5. The method of claim 1, wherein said adhesive layer is titanium, deposited using r.f. sputtering, to a thickness between about 200 to 500 Angstroms.

6. The method of claim 1, wherein said barrier layer is titanium nitride, deposited using r.f. sputtering, to a thickness between about 500 to 1000 Angstroms.

7. The method of claim 1, wherein said first metal layer is tungsten, deposited using LPCVD processing, at a temperature between about 400° to 500° C., to a thickness between about 6000 to 8000 Angstroms, using tungsten hexafluoride and silane.

8. The method of claim 1, wherein removal of said first metal layer, of said barrier layer, and of said adhesive layer, from surface of said dielectric layer, forming said first metal plug, in said contact hole, is performed using RIE processing, using $SF_6$ in nitrogen as an etchant.

9. The method of claim 1, wherein recessing of said first metal plug is performed via anisotropic, RIE procedures, using $SF_6$ in nitrogen as an etchant, resulting in said first metal plug being between about 1000 to 2000 Angstroms below the top surface of said dielectric layer.

10. The method of claim 1, wherein said second metal layer is tungsten, deposited using LPCVD processing, at a temperature between about 400° to 500° C., to a thickness between about 3000 to 5000 Angstroms, using tungsten hexafluoride and silane.

11. The method of claim 1, wherein removal of said second metal layer from surface of said dielectric layer, forming said composite metal plug, in said contact hole, is performed using RIE processing, using $SF_6$ in nitrogen as an etchant.

12. The method of claim 1, wherein said interconnect metallization layer is aluminum, containing between about 0.5 to 3% copper, deposited using r.f. sputtering, to a thickness between about 4000 to 8000 Angstroms.

13. A method for fabricating a MOSFET device, on a semiconductor substrate, using a voidless, tungsten plug, to fill a contact hole, that will provide electrical contact between an active silicon device region, in a semiconductor substrate, and an overlying interconnect metallization structure, comprising the steps of:

providing said active device region, in said semiconductor substrate;

depositing a dielectric layer on said semiconductor substrate, including depositing said dielectric layer on said active silicon device region;

photolithographic processing to open a small diameter region in a photoresist layer, exposing said dielectric layer, directly overlying said active silicon device region;

anisotropic etching of said dielectric layer, in said small diameter region, opened in said photoresist layer, to create a contact hole, between about 0.30 to 0.50 μM, in diameter, in said dielectric layer, to said active silicon device region;

removing said photoresist layer;

surface cleaning of said active silicon device region;

depositing a titanium layer, to a thickness between about 200 to 500 Angstroms, on top surface of said dielectric layer, on sides of said small diameter contact hole, and on active silicon device region;

depositing a titanium nitride layer, to a thickness between about 500 to 1000 Angstroms, on said titanium layer;

depositing a first tungsten layer, on said titanium nitride layer, filling said small diameter contact hole, resulting in a seam in the center of said first tungsten layer;

removing said first tungsten layer, said titanium nitride layer, and said said titanium layer, from the top surface of said dielectric layer, forming a first tungsten plug, comprised of said first tungsten layer, with said seam in the center of said first tungsten layer, said titanium nitride layer, and said titanium layer, in said small diameter contact hole;

anisotropic etching of said first tungsten plug, to recess said first tungsten plug, in said small diameter contact hole, below the top surface of said dielectric layer, with said titanium layer, said titanium nitride layer, and said first tungsten layer all recessed to the same level below the top surface of said dielectric layer, wherein said anisotropic etching of said first tungsten plug, changes said seam, in center of said first tungsten layer, to a void, in the center of said first tungsten layer;

depositing a second tungsten layer, using tungsten hexafluoride and silane, at a temperature between about 400° to 500° C. to a thickness between about 3000 to 5000 Angstroms, on top surface of said dielectric layer, and on said first tungsten plug, recessed in said small diameter contact hole, completely filling said void in the center of said first tungsten layer, in said first tungsten plug;

removing said second tungsten layer from top surface of said dielectric layer, forming a voidless, composite tungsten plug, in said small diameter contact hole;

depositing an interconnection metallization layer on top surface of said dielectric layer, and on said voidless, composite tungsten plug, in said small diameter contact hole; and patterning of said interconnect metallization layer, to form said metal interconnect structure.

14. The method of claim 13, wherein said active silicon device region, in said semiconductor substrate, is an N type, heavily doped source and drain region.

15. The method of claim 13, wherein said dielectric layer is silicon oxide, deposited using either LPCVD, PECVD, or APCVD processing, at a temperature between about 400° to 800° C., to a thickness between about 5000 to 10000 Angstroms.

16. The method of claim 13, wherein said small diameter contact hole is formed via anisotropic, RIE processing, using $CHF_3$ as an etchant, having an opening between about 0.3 to 0.5 um in diameter, and resulting in an aspect ratio between about 1 to 3.

17. The method of claim 13, wherein said titanium layer is deposited using r.f. sputtering, to a thickness between about 200 to 500 Angstroms.

18. The method of claim 13, wherein said titanium nitride layer is deposited via r.f. sputtering, to a thickness between about 500 to 1000 Angstroms.

19. The method of claim 13, wherein said first tungsten layer is deposited using LPCVD processing, at a temperature between about 400° to 500° C., to a thickness between about 6000 to 8000 Angstroms, using tungsten hexafluoride and silane.

20. The method of claim 13, wherein removal of said first tungsten layer, of said titanium nitride layer, and of said titanium layer, from top surface of said dielectric layer, forming said first tungsten plug in said small diameter contact hole, is performed using RIE processing, using $SF_6$ in nitrogen as an etchant.

21. The method of claim 13, wherein recessing of said first tungsten plug is performed using an anisotropic, RIE process, using $SF_6$ in nitrogen as an etchant, resulting in said first tungsten plug being between about 1000 to 2000 Angstroms below the top surface of said dielectric layer.

22. The method of claim 13, wherein removal of said second tungsten layer, from the top surface of said dielectric layer, forming said composite tungsten plug, in said small diameter contact hole, is performed using RIE procedures, using $SF_6$ in nitrogen as an etchant.

23. The method of claim 13, wherein said interconnect metallization layer is aluminum, containing between about 0.5 to 3% copper, deposited using r.f. sputtering, to a thickness between about 4000 to 8000 Angstroms.

* * * * *